United States Patent
Tekavec et al.

(10) Patent No.: US 6,322,659 B1
(45) Date of Patent: Nov. 27, 2001

(54) SYSTEM AND METHOD FOR DUAL HEAD BONDING

(75) Inventors: Randy V. Tekavec, Garland; Larry Giaudrone, Dallas; Peter Sakakini, Frisco, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/339,529

(22) Filed: Jun. 24, 1999

Related U.S. Application Data

(60) Provisional application No. 60/094,053, filed on Jul. 24, 1998.

(51) Int. Cl.⁷ .............................. C09J 5/00; B23K 31/02
(52) U.S. Cl. .................. 156/312; 156/322; 228/179.1; 228/180.5; 228/212
(58) Field of Search .................. 228/4.5, 6.2, 5.5, 228/180.21, 180.5, 1.1, 110.1, 9, 12, 102, 44.7, 179.1, 180.1; 156/73.2, 539, 556, 312, 322, 309.9

(56) References Cited

U.S. PATENT DOCUMENTS

| | | | |
|---|---|---|---|
| 4,301,958 | * 11/1981 | Hatakenaka et al. | 228/4.5 |
| 4,674,670 | * 6/1987 | Watanabe et al. | 228/102 |
| 4,887,758 | * 12/1989 | Suzuki et al. | 228/5.1 |
| 5,137,201 | * 8/1992 | Yamazaki et al. | 228/103 |
| 5,979,743 | * 9/1999 | Test | 228/180.5 |
| 6,206,274 | * 3/2001 | Ball | 228/180.5 |

\* cited by examiner

*Primary Examiner*—Richard Crispino
*Assistant Examiner*—Kevin P. Shortsle
(74) *Attorney, Agent, or Firm*—Jacqueline J. Garner; W. James Brady, III; Frederick J. Telecky, Jr.

(57) ABSTRACT

A method for bonding includes positioning a bonding strip adjacent a sole first bond head, the bonding strip having a plurality of strip units, and bonding, with only the first bond head, a first number of the plurality of strip units. The method further includes transporting the bonding strip from the first bond head and positioning the bonding strip adjacent a sole second bond head, and bonding, with only the second bond head, a remaining number of the plurality of strip units on the bonding strip. In one embodiment, the method also includes heating at least one of the plurality of strip units prior to bonding the bonding strip. In one embodiment, the method also includes clamping, with a sole clamp, the bonding strip, thereby limiting warpage of the bonding strip.

12 Claims, 6 Drawing Sheets

SYSTEM AND METHOD FOR DUAL HEAD BONDING

This application claims priority under 35 USC §119(e)(1) of provisional application No. 60/094,053 filed Jul. 24, 1998

TECHNICAL FIELD OF THE INVENTION

This invention relates generally to bonding systems and, more particularly, to a system and method for dual head bonding.

BACKGROUND OF THE INVENTION

Bonding systems are used to complete an interconnection between an integrated circuit chip and lead fingers of a bonding strip by bonding together or electrically coupling a plurality of bond pads of the integrated circuit chip to corresponding lead fingers on the bonding strip. In mass production, the bonding strip often includes a plurality of integrated circuit chips that may be separated after the bond pads of each integrated circuit chip have been bonded to corresponding lead fingers on the bonding strip. Thus, the bonding strip often includes a plurality of strip units with each strip unit having a single integrated circuit chip electrically coupled to lead fingers of the bonding strip.

One example of a bonding system is a dual head bonding system. Dual head bonding systems generally have two bond heads adjacent and in close proximity to one another for simultaneously bonding different strip units of the same bonding strip. Clamps are generally used to secure the bonding strip in two places while the two bond heads simultaneously bond different strip units of the bonding strip. Additionally, the dual head bonding system generally includes a heater positioned adjacent the two bond heads for heating the bonding strip during bonding. The dual head bonding system also generally includes a transfer mechanism for positioning various strip units of the bonding strip adjacent the two bond heads and for transporting the bonding strip to and from the two bond heads.

Dual head bonding systems, however, suffer several disadvantages. For example, since both bond heads are used to simultaneously bond different strip units of the same bonding strip, the two bond heads must be positioned so that the distance between the two bond heads is a multiple of the distance between strip units of the bonding strip. Thus, processing different bonding strips requires repositioning each bond head for each different bonding strip. Additionally, as heat is applied to the bonding strip during the bonding process, bonding strip warpage occurs in an area of the bonding strip between the clamps due to temperature expansion of the bonding strip. As the bonding strip warps, the interconnection between the integrated circuit chip and the lead fingers of the bonding strip may become defective.

SUMMARY OF THE INVENTION

Accordingly, a need has arisen for an improved dual head bonding system and method. The present invention provides an improved dual head bonding system and method that addresses shortcomings of prior dual head bonding systems and improves efficiency.

According to one embodiment of the invention, a method for bonding includes positioning a bonding strip adjacent a sole first bond head, the bonding strip having a plurality of strip units, and bonding, with only the first bond head, a first number of the plurality of strip units. The method further includes transporting the bonding strip from the first bond head and positioning the bonding strip adjacent a sole second bond head, and bonding, with only the second bond head, a remaining number of the plurality of strip units on the bonding strip.

According to another embodiment of the invention, a bonding system includes a first bond head operable to bond a bonding strip, the bonding strip having a plurality of strip units. The system also includes a second bond head operable to bond the bonding strip. The system further includes a first indexer operable to successively position each of a first number of the plurality of strip units adjacent the first bond head and a second indexer operable to transfer the bonding strip from the first bond head to the second bond head and successively position each of a second number of the plurality of strip units adjacent the second bond head.

The invention provides several technical advantages. For example, in one embodiment of the invention, the dual head bonding system provides for greater reliability of the bonding strips by substantially eliminating heat related warpage of the bonding strip during the bonding process. In the same embodiment, the dual head bonding system provides greater efficiency than conventional dual head bonding systems by utilizing two indexers for retrieving, transporting, and sequencing bonding strips between the bond heads.

Other technical advantages will be readily apparent to one skilled in the art from the following figures, descriptions, and claims.

BRIEF DESCRIPTION OF THE DRAWINGS

For a complete understanding of the present invention and the advantages thereof, reference is now made to the following descriptions taken in connection with the accompanying drawings in which.

DETAILED DESCRIPTION OF THE INVENTION

Embodiments of the present invention and its advantages are best understood by referring to FIGS. 1 through 5 of the drawings, like numerals being used for like and corresponding parts of the various drawings.

Figure 1:
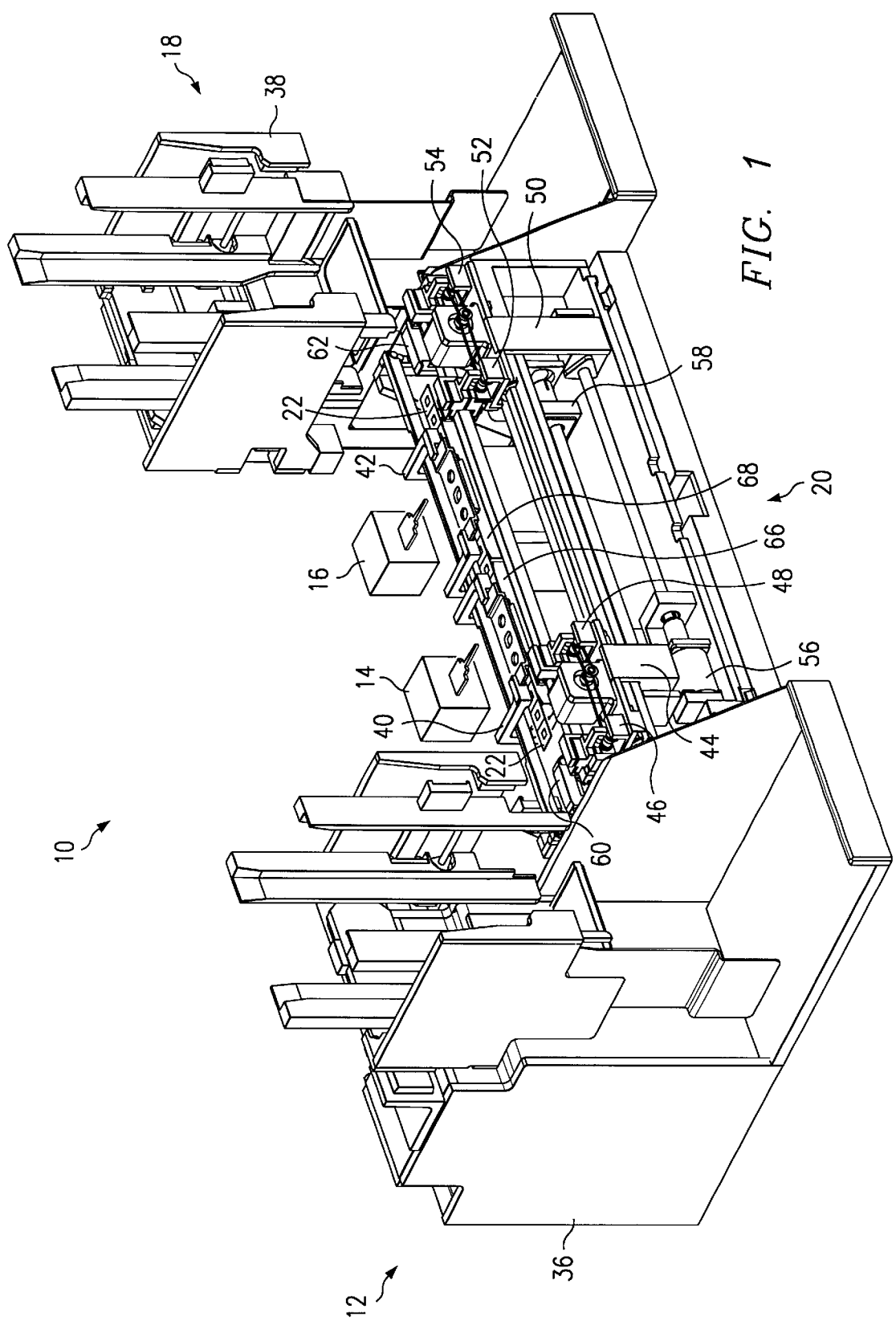
FIG. 1 is an isometric drawing of a dual head bonding system constructed in accordance with the present invention.

FIG. 1 illustrates an isometric view of a dual head bonding system 10 incorporating the teachings of the present invention. Bonding system 10 includes an input unit 12, two bond heads 14 and 16, an output unit 18, and a transfer system 20. In general, transfer system 20 retrieves bonding strips 22 from input unit 12 and transports bonding strips 22 between input unit 12, bond heads 14 and 16, and output unit 18. As will be described in greater detail in conjunction with FIG. 2A, bond heads 14 and 16 bond bonding strips 22 as bonding strips 22 are transported to and between bond heads 14 and 16 using transfer system 20.

Figure 2A:
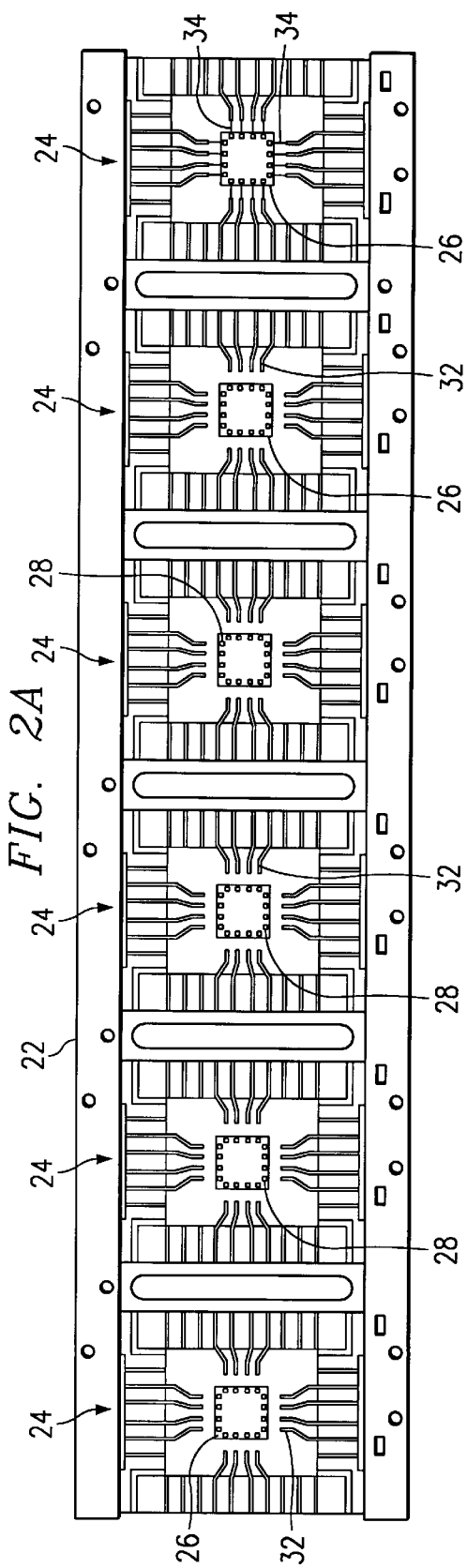
FIG. 2A is a drawing illustrating a plan view of a bonding strip having a plurality of strip units.
Figure 2B:
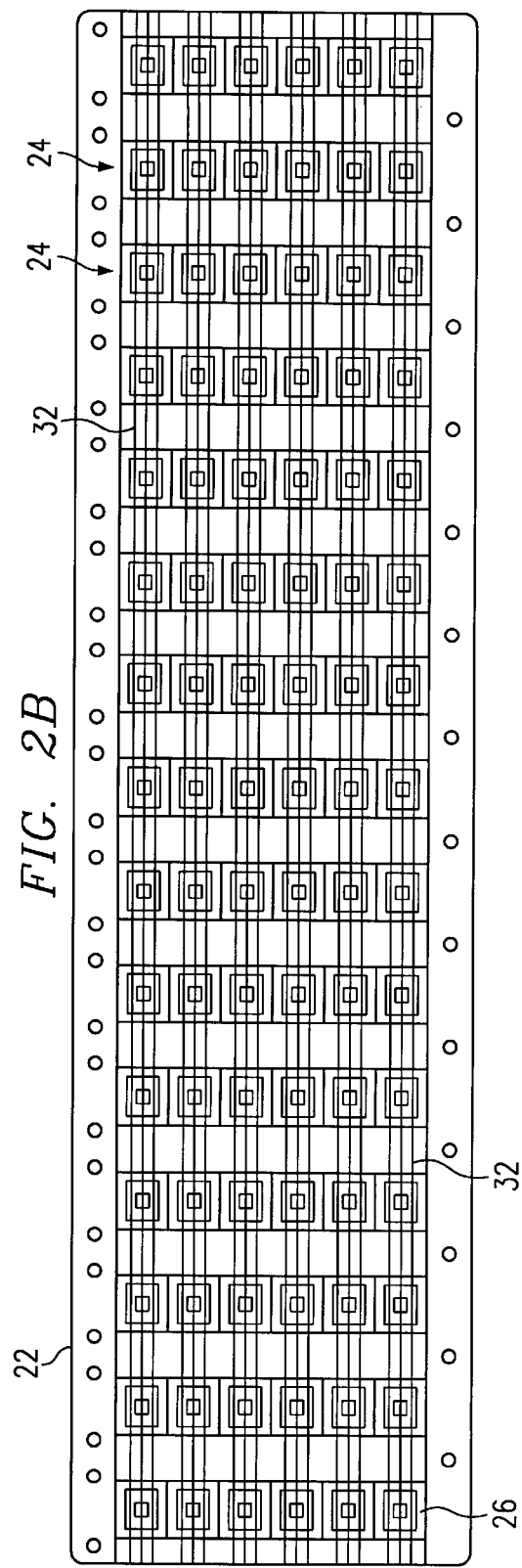
FIG. 2B is a drawing illustrating a plan view of a bonding strip having an array of columns and rows of strip units.

FIG. 2A is a plan view of bonding strip 22 having a single row of strip units 24, and FIG. 2B is a plan view of bonding strip 22 having an array of columns and rows of strip units 24. Although not shown in FIGS. 2A and 2B, bond heads 14 and 16 bond bonding strips 22 as bonding strips 22 are transported to and between bond heads 14 and 16 using transfer system 20. As best illustrated in FIG. 2A, each strip unit 24 includes an integrated circuit chip 26 having a plurality of bond pads 28. Each strip unit 24 of bonding strip 22 also includes lead fingers 32. Bond heads 14 and 16 electrically couple, bond or interconnect lead fingers 32 to bond pads 28 of integrated circuit chips 26. For example, lead fingers 32 may be electrically coupled to bond pads 28 using wires 34.

Referring to FIG. 1, in one embodiment of the invention, input unit 12 includes an elevator system 36 for retrieving bonding strips 22 from a magazine or carrier (not explicitly shown) and supplying bonding strips 22 to transfer system 20. However, input unit 12 may include other suitable methods or devices for supplying bonding strips 22 to transfer system 20. For example, input unit 12 may be part of a continuous flow conveyor system (not explicitly shown). Additionally, in one embodiment of the invention, output unit 18 includes an elevator system 38 for receiving bonding strips 22 from transfer system 20 and transporting bonding strips 22 to a magazine or carrier (not explicitly shown). However, output unit 18 may include other suitable methods or systems for receiving bonding strips 22 from transfer system 20. For example, output unit 18 may also be part of a continuous flow conveyor system (not explicitly shown) for transporting bonding strips 22 to packaging or subsequent processing operations.

Bonding system 10 also includes clamps 40 and 42 adjacent bond heads 14 and 16, respectively. Clamps 40 and 42 secure bonding strips 22 adjacent bond heads 14 and 16, respectively, while bond heads 14 and 16 bond bonding strips 22. As illustrated in FIG. 1, each clamp 40 and 42 secures a single bonding strip 22 adjacent a single bond head 14 and 16, respectively. For example, clamp 40 secures a single bonding strip 22 adjacent bond head 14 while bond head 14 bonds bonding strip 22. By securing a single bonding strip 22 adjacent each bond head 14 and 16, heat related warpage of bonding strips 22 during the bonding process is substantially eliminated because each bonding strip 22 is independently clamped adjacent a single bond head 14 or 16. Thus, each end of bonding strip 22 remains unconstrained during the bonding process allowing each end of bonding strip 22 to expand under heat. Therefore, bonding system 10 provides a more reliable interconnection between bond pads 28 of integrated circuit chips 26 and lead fingers 32 than conventional dual head bonding systems. Clamps 40 and 42 are shown and described in greater detail in conjunction with FIG. 3.

Figure 3:
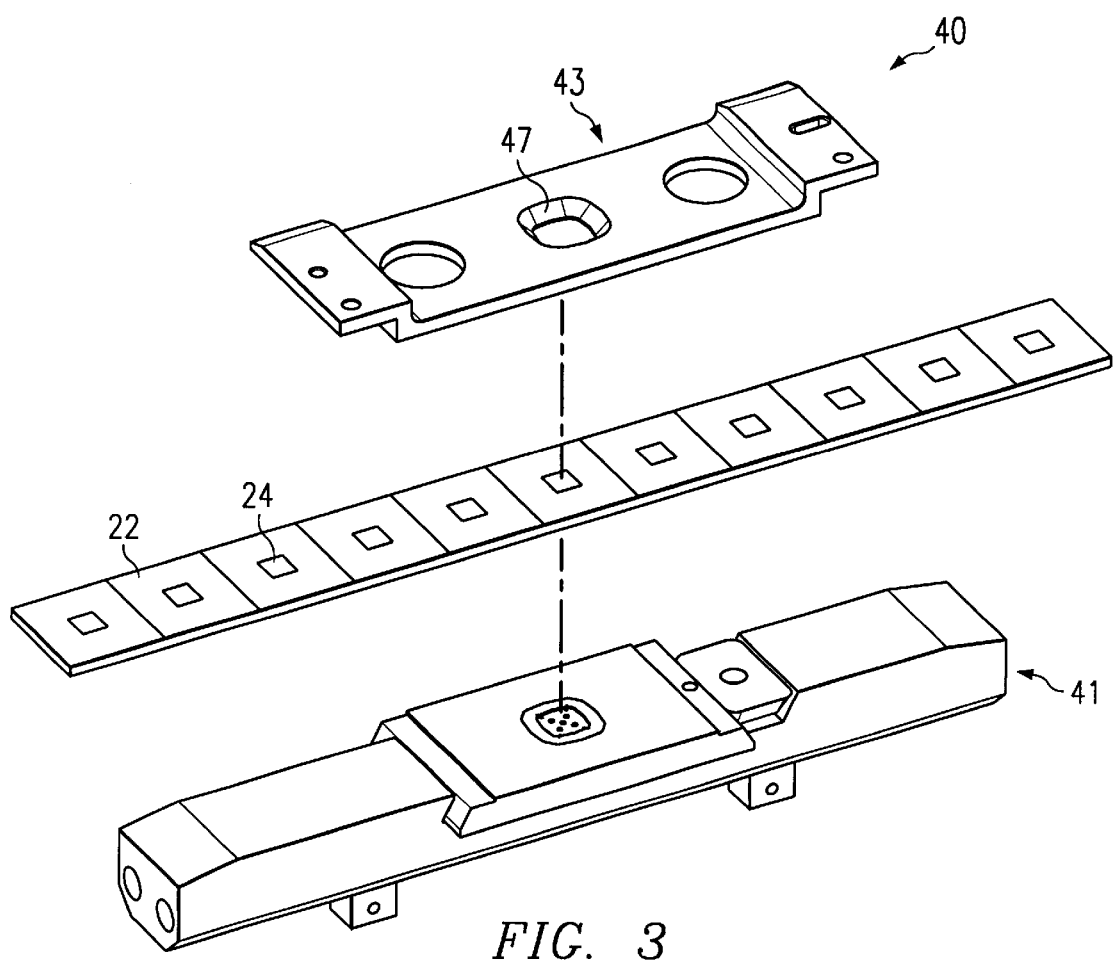
FIG. 3 is a drawing illustrating a clamp for clamping bonding strips constructed in accordance with the present invention.

FIG. 3 is a drawing illustrating one embodiment of clamp 40; clamp 42 may be constructed in the same manner as described below for clamp 40. Clamp 40 includes a base 41 and a cover 43. Cover 43 includes an opening 47. In operation, bonding strips 22 are positioned between base 41 and cover 43 so that bonding strips 22 are secured between base 41 and cover 43. Cover 43 may also include a boss (not explicitly shown) on a surface of cover 43 extending outwardly toward base 41 for seating against bonding strips 22. Opening 47 allows bonding of strip units 24 of bonding strips 22 while bonding strips 22 are secured using clamp 40. Clamp 40 is illustrated in FIG. 3 having a single opening 47; however, clamps 40 and 42 may also include a plurality of openings 47 for bonding a plurality of strip units 24 of bonding strip 22 while bonding strip 22 is secured adjacent a single bond head 14 or 16.

Referring to FIG. 1, transfer system 20 of bonding system 10 includes an indexer 44 having grippers 46 and 48 and an indexer 50 having grippers 52 and 54. Indexers 44 and 50 transport bonding strips 22 between input unit 12, bond heads 14 and 16, and output unit 18. Grippers 46, 48, 52 and 54 open and close to release or secure, respectively, bonding strips 22 for transport between input unit 12, bond heads 14 and 16, and output unit 18. For example, indexer 44, using gripper 46, retrieves bonding strips 22 from input unit 12 and transports bonding strips 22 to bond head 14. Although FIG. 1 illustrates bonding strip 22 material flow from left to right, or from input unit 12 to output unit 18, indexers 44 and 50 may also be used to transport bonding strips 22 in the opposite direction, for example, from bond head 16 to bond head 14. Thus, bonding system 10 may be linked or combined with other bonding strip 22 processing equipment for continuous flow manufacturing of bonding strips 22 having bonding strip 22 material flow in any direction.

In the embodiment illustrated in FIG. 1, indexers 44 and 50 are driven by lead screw motor systems 56 and 58, respectively; however, other suitable methods or devices may be used to drive indexers 44 and 50. Therefore, indexers 44 and 50 function independently of one another allowing for independent movement of indexers 44 and 50. For example, indexer 44 may be driven toward input unit 12 for retrieving another bonding strip 22 while indexer 50 is driven toward output unit 18 for depositing another bonding strip 22 in output unit 18. Thus, indexers 44 and 50 are independently driven for increased flexibility and improved efficiency of bonding system 10.

Additionally, indexers 44 and 50 index or position bonding strips 22 for transport to and between bond heads 14 and 16. For example, bond heads 14 and 16 are located at predetermined distances from each other and at predetermined distances from input unit 12 and output unit 18. For example, these predetermined distances may be based on a length or type of bonding strip 22 being processed using bonding system 10. Indexer 44 indexes bonding strip 22 so that when indexer 44 completes transporting bonding strip 22 from input unit 12 to bond head 14, one or more desired strip units 24 of bonding strip 22 are positioned adjacent bond head 14 in preparation for bonding using bond head 14. These predetermined distances and the distances between strip units 24 of bonding strips 22 are stored in a computer or processor (not explicitly shown) so that indexers 44 and 50 accurately position bonding strips 22 throughout bonding system 10. These indexing and positioning operations are described in greater detail with respect to FIGS. 3 through 5.

Additionally, indexers 44 and 50 cooperate with clamps 40 and 42 so that once bonding strips 22 have been indexed, indexers 44 and 50 accurately position strip units 24 of bonding strips 22 throughout bonding system 10. For example, indexer 44 indexes bonding strip 22 using gripper 46 and transports bonding strip 22 to bond head 14. Clamp 40 secures bonding strip 22 adjacent bond head 14 prior to gripper 46 releasing bonding strip 22. After bond head 14 completes bonding on bonding strip 22, gripper 46 of indexer 44 secures bonding strip 22 prior to clamp 40 releasing bonding strip 22. Thus, once bonding strip 22 has been indexed, clamps 40 and 42 and grippers 46, 48, 52, and 54 cooperate to maintain accurate indexing locations of bonding strips 22 throughout bonding system 10.

Grippers 46, 48, 52 and 54 also function independently of each other. Therefore, each gripper 46, 48, 52, or 54 independently opens and closes to release or secure, respectively, bonding strips 22. Thus, indexers 44 and 50 can transport up to four bonding strips 22, for example, with each gripper 46, 48, 52, and 54 securing a single bonding strip 22. As will be described in greater detail in conjunction with FIGS. 3 through 5, grippers 46, 48, 52 and 54 may be alternately used for different tasks throughout bonding system 10 depending on variables such as the quantity of strip units 24 included in bonding strip 22, the distance between strip units 24, and the sequence of material bonding operations desired. Thus, bonding system 10 provides greater flexibility than conventional dual head bonding systems.

In one embodiment of the invention, bonding system 10 also includes a pre-heat station 60 and a post-bond bake station 62. Pre-heat station 60 heats one or more of strip units 24 of bonding strip 22 prior to transporting bonding strip 22 to bond head 14. Post-bond bake station 62 heats one or more of strip units 24 of bonding strip 22 after bonding strip units 24. In one embodiment of the invention, pre-heat station 60 and post-bond bake station 62 include electrical coil resistance heating elements (not explicitly shown); however other suitable heating methods or devices may be used for heating bonding strips 22. Pre-heat station 60 and post-bond bake station 62 provide several technical advantages. For example, heating strip units 24 of bonding strip 22 prior to and after bonding bonding strip 22 increases the shear strength of the bond and enhances the intermetallic growth between bonding materials.

In operation, for example, indexer 44 retrieves bonding strip 22 from input unit 12 and positions one or more of strip units 24 of bonding strip 22 adjacent pre-heat station 60. After pre-heat station 60 heats strip units 24, indexer 44 transports bonding strip 22 to bond head 14 for bonding. Additionally, for example, after bonding strip units 24 using bond head 16, indexer 50 transports bonding strip 22 from bond head 16 to post-bond bake station 62 and positions one or more of strip units 24 adjacent post-bond bake station 62. After post-bond bake station 62 heats strip units 24, indexer 50 transports bonding strip 22 to output unit 18. Thus, bonding system 10 provides an improved interconnection between bond pads 28 of integrated circuit chip 26 and lead fingers 32 by using pre-heat station 60 and post-bond bake station 62 to enhance the bonding material properties of bonding strips 22.

Additionally, in one embodiment of the invention, bonding system 10 also includes heaters 66 and 68 adjacent bond heads 14 and 16, respectively. In operation, heaters 66 and 68 heat one or more strip units 24 of bonding strips 22 prior to and after bonding strip units 24 of bonding strips 22. For example, gripper 46 of indexer 44 retrieves bonding strip from input unit 12 and positions one or more of strip units 24 adjacent pre-heat station 60. After strip units 24 have been heated using pre-heat station 60, indexer 44 transports bonding strip 22 to bond head 14. While one strip units 24 are bonded using bond head 14, heater 66 heats one or more adjacent strip units 24 in preparation for bonding using bond head 14. Thus, heaters 66 and 68 are also used to enhance the interconnection between bond pads 28 of integrated circuit chip 26 and lead fingers 32 of bonding strips 22. A more detailed description for using heaters 66 and 68 in bonding system 10 will be provided in conjunction with FIGS. 3 through 5.

Thus, according to the above-described embodiments of the invention, bonding system 10 provides for an efficient and flexible method of processing different bonding strip 22 configurations without having the locations of bond heads 14 and 16 adjusted or altered. The following description provided in conjunction with FIGS. 3 through 5 illustrates the efficiency and flexibility of bonding system 10 processing a variety of bonding strip 22 and bonding configurations.

Figure 4:
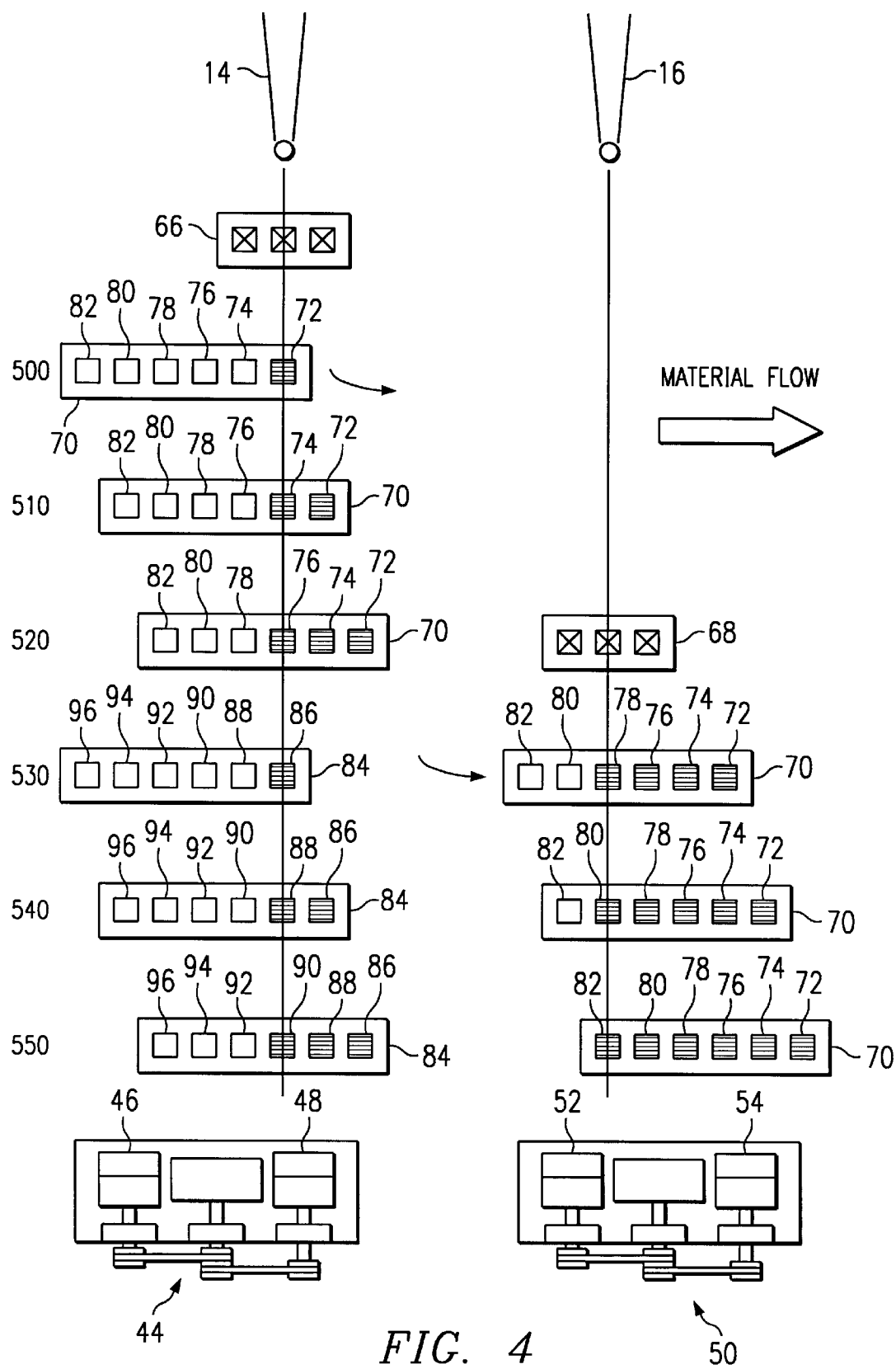
FIG. 4 is a schematic drawing illustrating a bonding sequence performed using a dual head bonding system constructed in accordance with the present invention on bonding strips having a quantity of strip units equal to an even integer.
Figure 5:
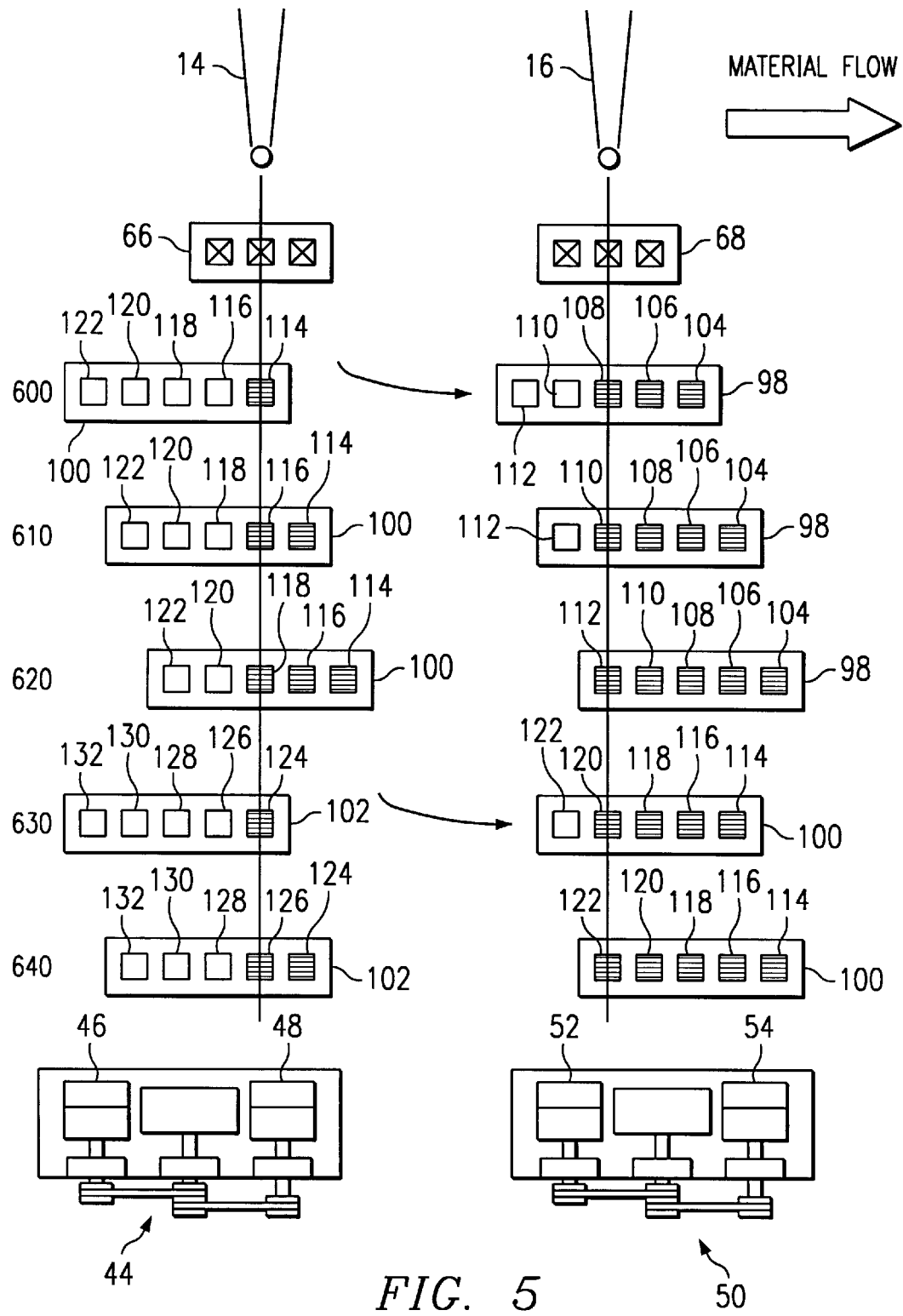
FIG. 5 is a schematic drawing illustrating a bonding sequence performed using a dual head bonding system constructed in accordance with the present invention on bonding strips having a quantity of strip units equal to an odd integer.

FIG. 4 is a schematic drawing illustrating the beginning of an indexing sequence of a bonding strip 70 between bond heads 14 and 16 wherein bonding strip 70 includes a quantity of strip units equal to an even integer. Numbers 500 through 550 illustrated in FIG. 4 represent a series of successive steps during the processing of bonding strip 70.

As illustrated in FIG. 4, bonding strip 70 includes strip units 72, 74, 76, 78, 80, and 82. Although not illustrated in FIG. 4, prior to a first step 500, gripper 46 of indexer 44 retrieves bonding strip 70 from input unit 12 and positions strip unit 72 adjacent pre-heat station 60 so that pre-heat station 60 heats strip unit 72 prior to bond head 14 bonding strip unit 72. Additionally, indexer 44 indexes bonding strip 70 so that upon completion of transporting bonding strip 70 to bond head 14, strip unit 72 will be positioned adjacent bond head 14.

After pre-heating strip unit 72, indexer 44 transports bonding strip 70 to bond head 14 at step 500. Although not illustrated in FIG. 4, before gripper 46 releases bonding strip 70, clamp 40 secures bonding strip 70 adjacent bond head 14. Thus, clamp 40 and gripper 46 cooperate to control the indexed location of bonding strip 70. For example, since clamp 40 secures bonding strip 70 prior to gripper 46 releasing bonding strip 70, gripper 46 retrieves and secures bonding strip 70 from clamp 40 in the same indexed location. Thus, clamp 40 and gripper 46 cooperate to control the indexed location of bonding strip 70 so that indexer 44 accurately positions bonding strip 70 at the next processing location within bonding system 10. Accordingly, clamps 40 and 42 secure bonding strip 70 prior to grippers 46, 48, 52, or 54 releasing bonding strip 70 throughout bonding system 10.

While bond head 14 bonds strip unit 72, heater 66 pre-heats strip unit 74 in preparation for bonding. Heaters 66 and 68 are shown adjacent bonding strip 70 and bond heads 14 and 16 in FIGS. 3 through 5 to illustrate the position of various strip units in relation to heaters 66 and 68 during the indexing sequence.

After bond head 14 completes bonding strip unit 72, gripper 46 secures bonding strip 70 and positions strip unit 74 adjacent bond head 14 at a step 510. While bond head 14 bonds strip unit 74, strip units 72 and 76 are post-bond baked and pre-heated, respectively, using heater 66.

After bond head 14 completes bonding strip unit 74, gripper 48 of indexer 44 secures bonding strip 70 and positions strip unit 76 adjacent bond head 14 at a step 520. While bond head 14 bonds strip unit 76, strip units 74 and 78 are post-bond baked and pre-heated, respectively, using heater 66.

Additionally, after clamp 40 secures bonding strip 70 from gripper 46 of indexer 44, indexer 44 is free to retrieve the next bonding strip, for example, bonding strip 84, from input unit 12 and position strip unit 86 of bonding strip 84 adjacent pre-heat station 60. Indexer 44 may retrieve bonding strip 84 at any time while clamp 40 secures bonding strip 70 adjacent bond head 14. For example, indexer 44 may retrieve bonding strip 84 while bond head 14 bonds strip unit 72 at step 500, while bond head 14 bonds strip unit 74 at step 510, or while bond head bonds strip unit 76 at step 520. Thus, indexers 44 and 50 may be efficiently performing additional processing operations while bond heads 14 and 16 are bonding.

Gripper 52 of indexer 50 secures bonding strip 70 and transports bonding strip 70 from bond head 14 to bond head 16 at a step 530. Indexer 50 positions strip unit 78 adjacent bond head 16 for bonding using bond head 16. While bond head 16 bonds strip unit 78, strip units 76 and 80 are post-bond baked and pre-heated, respectively, using heater 68. Thus, although bond head 14 bonds strip unit 76, heater 68 adjacent bond head 16 post-bond bakes strip unit 76. Also, at step 530, gripper 46 of indexer 44 positions strip unit 86 of bonding strip 84 adjacent bond head 14. While bond head 14 bonds strip unit 86, strip unit 88 is pre-heated using heater 66.

Gripper 52 of indexer 50 secures bonding strip 70 and positions strip unit 80 adjacent bond head 16 at a step 540. While bond head 16 bonds strip unit 80, strip units 78 and 82 are post-bond baked and pre-heated, respectively, using heater 68. Additionally, at step 540, gripper 46 of indexer 44 secures bonding strip 84 and positions strip unit 88 adjacent bond head 14. While bond head 14 bonds strip unit 88, strip units 86 and 90 are post-bond baked and pre-heated, respectively, using heater 66.

Gripper 52 of indexer 50 secures bonding strip 70 and positions strip unit 82 adjacent bond head 16 at a step 550. While bond head 16 bonds strip unit 82, strip unit 80 is post-bond baked using heater 68. Also, at step 550, gripper 48 of indexer 44 secures bonding strip 84 and positions strip unit 90 adjacent bond head 14. While bond head 14 bonds strip unit 90, strip units 88 and 92 are post-bond baked and pre-heated, respectively, using heater 66.

After bond head 16 completes bonding strip unit 82 of bonding strip 70, gripper 54 of indexer 50 secures bonding strip 70 and transports bonding strip 70 to post-bond bake station 62. Indexer 50 positions strip unit 82 adjacent post-bond bake station 62 for heating strip unit 82. Also, gripper 52 of indexer 50 secures bonding strip 84 and positions strip unit 92 of bonding strip 84 adjacent bond head 16 for bonding using bond head 16. Thus, bond head 16 will bond strip units 94 and 96 of bonding strip 84. Additionally, while indexer 50 transports bonding strips 70 and 84, indexer 44 transports the next bonding strip to bond head 14 to continue the above-described indexing sequence.

Accordingly, bonding system 10 provides an efficient method of sequencing bonding strips 22 from input unit 12 to bond heads 14 and 16 and output unit 18. For example, although the above-described sequence describes using grippers 46, 48, 52 and 54 at particular steps during the sequencing process, the use of particular grippers 46, 48, 52 and 54 may be varied to meet a desired sequence of events or processes.

FIG. 5 is a schematic drawing illustrating an indexing sequence of bonding strips 98, 100, and 102 between bond heads 14 and 16 wherein each bonding strip 98, 100, and 102 includes a quantity of strip units 24 equal to an odd integer. Thus, bonding strip 98 includes strip units 104, 106, 108, 110, and 112, bonding strip 100 includes strip units 114, 116, 118, 120 and 122, and bonding strip 102 includes strip units 124, 126, 128, 130, and 132. Numbers 600 through 640 illustrated in FIG. 5 represent a series of successive steps during the processing of bonding strips 98, 100, and 102.

As illustrated in FIG. 5, strip unit 108 of bonding strip 98 is positioned adjacent bond head 16 at a first step 600. Although not illustrated in FIG. 5, strip units 104 and 106 have been bonded using bond head 14 prior to indexer 50 transporting bonding strip 98 to bond head 16. While bond head 16 bonds strip unit 108, strip units 106 and 110 are post-bond baked and pre-heated, respectively, using heater 68.

Additionally, at step 600, indexer 44 transports bonding strip 100 to bond head 14 and positions strip unit 114 adjacent bond head 14. Although not shown in FIG. 5, strip unit 114 is pre-heated using pre-heat station 60 prior to indexer 44 transporting bonding strip 100 to bond head 14. While bond head 14 bonds strip unit 114, strip unit 116 is pre-heated using heater 66.

Indexer 50 secures bonding strip 98 and positions strip unit 110 adjacent bond head 16 at a step 610. While bond head 16 bonds strip unit 110, strip units 108 and 112 are post-bond baked and pre-heated, respectively, using heater 68. Also, at step 610, indexer 44 secures bonding strip 100 and positions strip unit 116 adjacent bond head 14. While bond head 14 bonds strip unit 116, strip units 114 and 118 are post-bond baked and pre-heated, respectively, using heater 66.

Indexer 50 secures bonding strip 98 and positions strip unit 112 adjacent bond head 16 at a step 620. While bond head 16 bonds strip unit 112, strip unit 110 is post-bond baked using heater 68. Additionally, at step 620, indexer 44 secures bonding strip 100 and positions strip unit 118 adjacent bond head 14. While bond head 14 bonds strip unit 118, strip units 116 and 120 are post-bond baked and pre-heated, respectively, using heater 66.

Indexer S0 secures bonding strip 100 and positions strip unit 120 adjacent bond head 16 at a step 630. Although not explicitly shown in FIG. 5, indexer 50 also secures bonding strip 98 and transports bonding strip 98 to post-bond bake station 62. For example, gripper 52 may be used to secure bonding strip 100 and gripper 54 may be used to secure bonding strip 98 and position strip unit 112 of bonding strip 98 adjacent post-bond bake station 62. As illustrated in FIG. 5, strip unit 120 of bonding strip 100 is pre-heated using heater 66 adjacent bond head 14 prior to indexer 50 transporting bonding strip 100 to bond head 16. While bond head 16 bonds strip unit 120, strip units 118 and 122 are post-bond baked and pre-heated, respectively, using heater 68.

Also, at step 630, indexer 44 secures bonding strip 102 and transports bonding strip 102 to bond head 14. Indexer 44 positions strip unit 124 adjacent bond head 14 for bonding using bond head 14. Although not explicitly shown in FIG. 5, strip unit 124 is pre-heated using pre-heat station 60 prior to indexer 44 transporting bonding strip 102 to bond head 14. While bond head 14 bonds strip unit 124, strip unit 126 is pre-heated using heater 66.

Indexer 50 secures bonding strip 100 and positions strip unit 122 adjacent bond head 16 at a step 640. While bond head 16 bonds strip unit 122, strip unit 120 is post-bond baked using heater 68. Also, at step 640, indexer 44 secures bonding strip 102 and positions strip unit 126 adjacent bond head 14. While bond head 14 bonds strip unit 126, strip units 124 and 128 are post-bond baked and pre-heated, respectively, using heater 66.

Therefore, according to the above-described embodiment of the invention, both bond heads 14 and 16 are utilized to bond bonding strips 22 having a quantity of strip units 24 equal to an odd integer. Thus, bonding system 10 provides for greater efficiency than conventional dual head bonding systems. For example, although not explicitly shown in FIG. 5, according to the sequence of steps 600 through 640 illustrated in FIG. 5, bond head 16 bonds strip units 128, 130, and 132 of bonding strip 102. Thus, bonding system 10 uses a repeating sequence of steps for processing bonding strips between bond heads 14 and 16 so that neither bond head 14 nor bond head 16 is idle.

For example, for a bonding strip 22 having a quantity of strip units 24 equal to five, bond head 14 bonds two of the five strip units 24 while bond head 16 bonds the remaining three strip units 24. However, the next bonding strip 22 to be processed using bond head 14 has three of its five strip units 24 processed using bond head 14 while bond head 16 bonds the remaining two strip units 24. Thus, using this repeating sequence of steps, neither bond head 14 nor bond head 16 is idle. Thus, bonding system 10 provides greater efficiency than conventional bonding systems.

Figure 6:
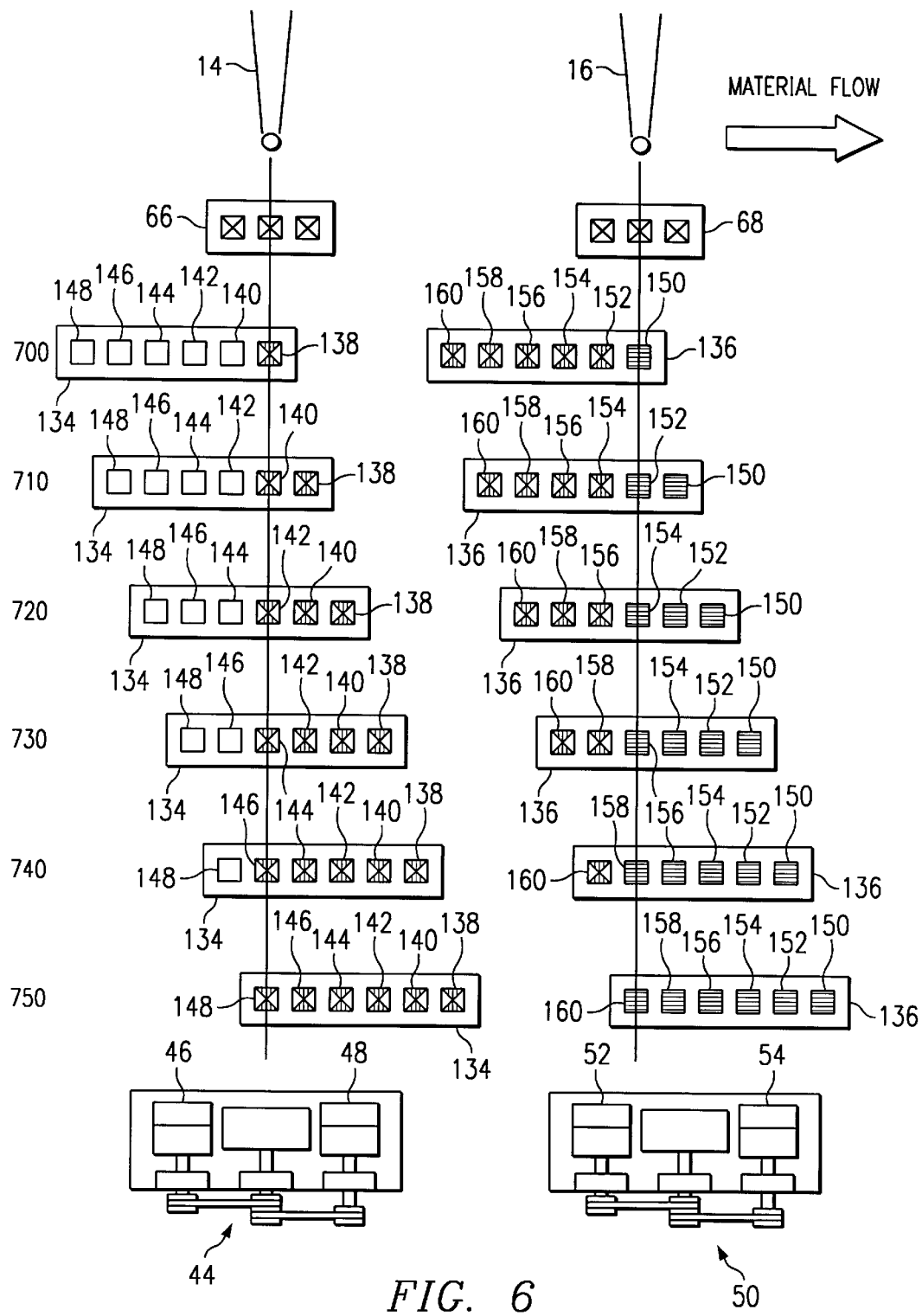
FIG. 6 is a schematic drawing illustrating a BowTI™ bonding configuration sequence performed using a dual head bonding system constructed in accordance with the present invention.

FIG. 6 is a schematic drawing illustrating an indexing sequence for bonding strips 134 and 136 wherein each strip unit 24 of bonding strips 134 and 136 receives a BowTI™ bonding configuration using bond heads 14 and 16. Numbers 700 through 750 illustrated in FIG. 6 represent a series of successive steps during processing of bonding strips 134 and 136.

As illustrated in FIG. 6, bonding strip 134 includes strip units 138, 140, 142, 144, 146, and 148, and bonding strip 136 includes strip units 150, 152, 154, 156, 158, and 160. Strip unit 138 of bonding strip 134 is positioned adjacent bond head 14 at a first step 700. Additionally, strip unit 150 of bonding strip 136 is positioned adjacent bond head 16. Although not explicitly shown in FIG. 6, indexer 44 is used to transport bonding strip 134 to bond head 14, and indexer 50 is used to transport bonding strip 136 from bond head 14 to bond head 16. Additionally, as previously described in conjunction with FIGS. 3–4, pre-heat station 60, heaters 66 and 68, and post-bond bake station 62 may be used to heat strip units 138, 140, 142, 144, 146, and 148 of bonding strip 134 and strip units 150, 152, 154, 156, 158, and 160 of bonding strip 136 prior to and after bonding using bond heads 14 and 16.

Indexer 50 secures bonding strip 136 and positions strip unit 152 adjacent bond head 16 at a step 710. Additionally, at step 710, indexer 44 secures bonding strip 134 and positions strip unit 140 adjacent bond head 14. Indexer 50 secures bonding strip 136 and positions strip unit 154 adjacent bond head 16 at a step 720. Also, at step 720, indexer 44 secures bonding strip 134 and positions strip unit 142 adjacent bond head 14.

Indexer 50 secures bonding strip 136 and positions strip unit 156 adjacent bond head 16 at a step 730. Also, at step 730, indexer 44 secures bonding strip 134 and positions strip unit 144 adjacent bond head. Indexer 50 secures bonding strip 136 and positions strip unit 158 adjacent bond head 16 at a step 740. Also, at step 740, indexer 44 secures bonding strip 134 and positions strip unit 146 adjacent bond head 14.

Indexer 50 secures bonding strip 136 and positions strip unit 160 adjacent bond head 16 at a step 750. Also, at step 750, indexer 44 secures bonding strip 134 and positions strip unit 148.adjacent bond head 14. Although not explicitly shown in FIG. 6, after bond heads 14 and 16 complete bonding strip units 148 and 160, respectively, indexer 44 transports another bonding strip 22 from input unit 12 to bond head 14 while indexer 50 transports bonding strips 134 and 136 to bond head 16 and output unit 18, respectively.

Therefore, according to the above-described embodiment of the invention, bonding system 10 may be used for bonding a BowTI™ configuration to bonding strips 22 by bonding in one direction using bond head 14, for example, vertically, and bonding in an opposite direction using bond head 16, for example, horizontally, Thus, bonding system 10 can be used to efficiently bond a variety of bonding configurations to bonding strips 22.

Although the present invention and its advantages have been described in detail, it should be understood that various changes, substitutions, and alterations, can be made therein without departing from the spirit and scope of the present invention as defined by the appended claims.

What is claimed is:

1. A method for bonding comprising:
   positioning a bonding strip adjacent a sole first bond head, the bonding strip having a plurality of strip units;
   bonding, with only the first bond head, a first number of the plurality of strip units;
   transporting the bonding strip from the first bond head and positioning the bonding strip adjacent a sole second bond head; and
   bonding, with only the second bond head, a remaining number of the plurality of strip units on the bonding strip.

2. The method of claim 1, wherein positioning further comprises clamping with a sole clamp, thereby limiting any warpage of the bonding strip.

3. The method of claim 1, wherein the step of bonding with only the second bond head comprises bonding, with only the second bond head, the remaining number of the plurality of strip units on the bonding strip, the remaining number being equal to the first number of the plurality of strip units on the bonding strip.

4. The method of claim 1, wherein the step of bonding only with the second bond head comprises bonding, with only the second bond head, the remaining number of the plurality of strip units on the bonding strip, the sum of the first number and the remaining number being an odd integer.

5. The method of claim 1, and further comprising heating at least one of the plurality of strip units prior to bonding the bonding strip.

6. the method of claim 1, and further comprising heating at least one of the plurality of strip units after bonding the bonding strip.

7. The method of claim 1, and further comprising:
   securing the bonding strip adjacent the first bond head with a first clamp;
   releasing the first clamp after bonding the bonding strip using the first bond head; and
   securing the bonding strip adjacent the second bond head with a second clamp.

8. The method of claim 1, and further comprising:
   retrieving the bonding strip from an input unit;
   positioning the bonding strip over a pre-heat station for heating at least one of the plurality of strip units prior to bonding the bonding strip; and
   transporting the bonding strip to the first bond head.

9. The method of claim 1, wherein the step of transporting the bonding strip from the first bond head to a second bond head comprises:
   securing the bonding strip with an indexer at the first bond head;
   releasing a first clamp securing the bonding strip adjacent the first bond head after securing the bonding strip with the indexer;

transporting the bonding strip from the first bond head to the second bond head using the indexer;

securing the bonding strip with a second clamp adjacent the second bond head; and releasing the bonding strip from the indexer after securing the bonding strip with the second clamp.

10. A method for bonding comprising:

transporting a first bonding strip to a first bond head, the first bonding strip having first, second, and third strip units;

bonding, with the first bond head, the first strip unit of the first bonding strip;

transporting the first bonding strip to a second bond head;

transporting a second bonding strip to the first bond head, the second bonding strip having first, second, and third strip units; and bonding, with the first bond head, the first and second strip units of the second bonding strip.

11. The method of claim 10, further comprising:

bonding, with the second bond head, the second and third strip units of the first bonding strip.

12. The method of claim 10, further comprising:

transporting the second bonding strip to the second bond head; and bonding, with the second bond head, the third strip unit of the second bonding strip.

* * * * *